United States Patent [19]

Kosa

[11] 4,356,041
[45] Oct. 26, 1982

[54] METHOD OF FABRICATING A MIS-TYPE DEVICE BY USING A GATE ELECTRODE AND SELECTIVELY IMPLANTED NITRIDE LAYER

[75] Inventor: Yasunobu Kosa, Kodaira, Japan

[73] Assignee: Hitachi, Ltd., Tokyo, Japan

[21] Appl. No.: 174,434

[22] Filed: Aug. 1, 1980

[30] Foreign Application Priority Data

Oct. 1, 1979 [JP] Japan .................................. 54-125411

[51] Int. Cl.³ .................... H01L 21/22; H01L 21/265
[52] U.S. Cl. ...................................... 148/1.5; 29/571;
148/187; 357/52; 357/91
[58] Field of Search .................. 148/1.5, 187; 29/571;
357/52, 91

[56] References Cited
U.S. PATENT DOCUMENTS

| | | | |
|---|---|---|---|
| 3,798,752 | 3/1974 | Fujimoto | 29/571 |
| 4,016,007 | 4/1977 | Wada et al. | 148/1.5 |
| 4,060,827 | 11/1977 | Ono et al. | 357/52 |
| 4,098,618 | 7/1978 | Crowder et al. | 148/1.5 |
| 4,105,805 | 8/1978 | Glendinning et al. | 148/1.5 |
| 4,113,515 | 9/1978 | Kooi et al. | 148/1.5 |
| 4,170,492 | 10/1979 | Bartlett et al. | 148/1.5 |
| 4,170,500 | 10/1979 | Crossley | 148/187 |
| 4,257,832 | 3/1981 | Schwabe et al. | 148/188 |
| 4,266,985 | 5/1981 | Ito et al. | 148/1.5 |
| 4,272,308 | 6/1981 | Varshney | 148/187 |

*Primary Examiner*—Upendra Roy
*Attorney, Agent, or Firm*—Antonelli, Terry & Wands

[57] ABSTRACT

The invention relates to a method of fabricating a semiconductor device and is characterized by the steps of selectively forming a polycrystalline silicon layer for a gate electrode on a semiconductor substrate, forming selectively a nitride film by ion implantation into the surface of the substrate, on which the silicon layer is not formed, and thereafter oxidizing the surface of the silicon layer using the nitride film as a mask thereby to form an oxidation film on the silicon layer.

16 Claims, 34 Drawing Figures

METHOD OF FABRICATING A MIS-TYPE DEVICE BY USING A GATE ELECTRODE AND SELECTIVELY IMPLANTED NITRIDE LAYER

BACKGROUND OF THE INVENTION

This invention relates to a method of fabricating a semiconductor device and more specifically to a method of fabricating an MIS (Metal Insulator Semiconductor) type semiconductor device using a polycrystalline silicon layer as a gate electrode.

In the conventional method of fabricating semiconductor devices using a Si gate process, it is known from U.S. Pat. No. 3,798,752 to thermally oxidize a gate electrode consisting of polycrystalline silicon and to make use of the resulting thermal oxidation film as an inter-layer insulation film in order to increase the integration density.

This U.S. Pat. No. 3,798,752 discloses a method which comprises forming a silicon nitride film on a semiconductor substrate before or after the formation of the gate electrode, oxidizing the surface of the gate electrode using the silicon nitride film as the mask and utilizing the thermal oxidation film thus obtained as an inter-layer insulation film.

However, when the silicon nitride film is formed before the formation of the gate electrode, the silicon nitride film remains below the gate electrode. Hence, the threshold voltage of an MIS type semiconductor device, or, MISFET, is difficult to control. Moreover, since charge is trapped in the silicon nitride film, this construction is not desirable as a construction of an MIS type semiconductor device to be used for a semiconductor memory circuit device such as a CCD (Charge Coupled Device) or a dynamic RAM (Random Access Memory).

When the silicon nitride film is formed after the formation of the gate electrode, on the other hand, there can be obtained a construction of an MIS type semiconductor element suited for a semiconductor memory circuit device because no such problem as described above occurs. However, no definite method of forming the silicon nitride film has been disclosed.

Accordingly, the present invention is directed to improve the latter method.

SUMMARY OF THE INVENTION

It is therefore a principal object of the present invention to provide a method of fabricating a novel semiconductor device protected by an insulation film which is electrically stable to a conductor layer and which has high reliability.

It is another object of the present invention to provide a method of fabricating a semiconductor device having a high integration density.

The basic construction of the present invention to accomplish these objects resides in that a conductor layer such as a gate electrode, a wiring layer or the like is selectively formed on a semiconductor substrate, a desired ion is then implanted into the surface portion of the semiconductor substrate, at which the conduction layer is not formed, to convert the surface portion into an oxygen impermeable layer and the surface of the conductor layer is thereafter oxidized using the oxygen impermeable layer as the mask.

DESCRIPTION OF THE PREFERRED EMBODIMENTS

EMBODIMENT 1

Figure 1:
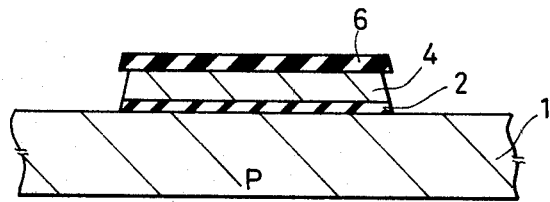
FIGS. 1 through 5 are sectional views each showing step-wise the semiconductor device in accordance with an embodiment of the present invention.

As shown in FIG. 1, a gate insulation film 2 such as an SiO$_2$ film is formed to a thickness of 50 nm on a semiconductor substrate 1 such as a P-type single crystal silicon substrate (hereinafter called "Si substrate") having a (100) crystal surface, and a conductor layer such as a polycrystalline silicon (hereinafter called "poly-Si") layer or a phosphorous doped poly-Si layer 4 is formed to a thickness of 400 nm on the surface of this SiO$_2$ film 2. Further, a masking film for the ion implantation to be later described, such as an SiO$_2$ film or an SiO$_2$ (PSG) film 6 containing P$_2$O$_5$ is formed to a thickness of 300 nm. The abovementioned SiO$_2$ film 6, poly-Si layer 4 and SiO$_2$ film 2 are continuously etched by an etching technique. As a result, there is obtained the Si substrate 1 having the gate electrode consisting of the poly-Si layer.

Figure 2:
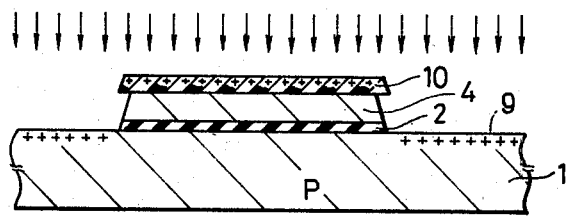

Next, nitrogen ion implantation is made over the entire surface perpendicularly with respect to the surface of the Si substrate 1 as illustrated in FIG. 2. The ion dose is 10$^{17}$ atoms/cm$^2$, for example. The ion implantation energy is selected to be, e.g., about 40 KeV, so that the nitrogen ion 10 implanted does not reach the poly-Si layer 4. Reference numeral 9 designates nitrogen that is implanted into the surface of the Si substrate 1.

Figure 3:
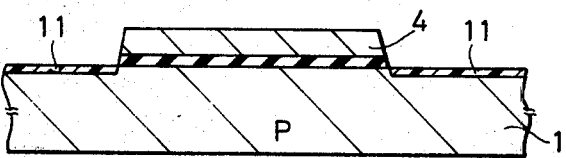

Next, as shown in FIG. 3, the SiO$_2$ film 6 is removed using an etching solution of a dilute hydrofluoric acid type and heat treatment at about 1,000° C. is carried out so as to react the nitrogen implanted into the surface of the Si substrate with Si of the substrate. As a result, about a 100 Å thick silicon nitride film (Si$_3$N$_4$ film), that can be used as an oxygen impermeable layer, is formed on the surface of the Si substrate 1.

Figure 4:
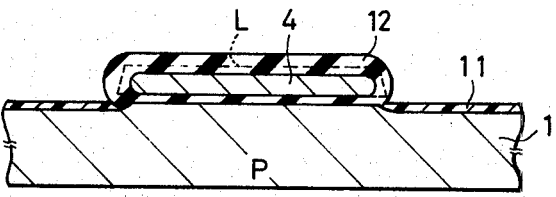

As illustrated in FIG. 4, the poly-Si layer 4 is oxidized in the steam of 900° C. for example, using this Si$_3$N$_4$ film 11 as the mask, thereby forming a 300 nm-thick thermal oxidation film on the poly-Si layer 4. In FIG. 4, dotted line L represents the shape of the poly-Si layer 4 under the state shown in FIG. 3.

Incidentally, it is possible to leave the SiO$_2$ film 2 shown in FIG. 1 unetched, then to implant the nitrogen ion into this SiO$_2$ film as shown in FIG. 2 and to convert this SiO$_2$ film 2 thus implanted with the nitrogen ion into a nitride film 11. This method provides an effect in which the surface of the Si substrate is not subjected to ion damage.

After the nitrogen ion implantation as shown in FIG. 3, thermal oxidation may be directly effected without etching the SiO$_2$ film 10. This method also provides the construction similar to the one shown in FIG. 4. In this case, the thickness of the thermal oxidation film formed on the poly-Si layer 4 becomes great. It is also possible to utilize the temperature that is elevated at the time of the high concentration ion implantation or the heat energy generated at the time of the thermal oxidation of the poly-Si instead of specifically carrying out the heat treatment for reacting the nitrogen implanted into the Si substrate 1 with the silicon (Si) of the substrate to form the Si$_3$N$_4$ film.

When the abovementioned steps are completed, the SiO$_2$ film (not shown) of a thickness of 100 Å or below formed on the surface of the Si$_3$N$_4$ film is removed with an etching solution of a dilute hydrofluoric acid type and the nitride film is subsequently removed with phosphoric acid heated to about 180° C., thereby yielding a cross-sectional structure shown in FIG. 5.

EMBODIMENT 2

An embodiment for obtaining a memory cell of a dynamic RAM from the structure of a semiconductor substrate shown in FIG. 5 will be explained.

Figure 5:
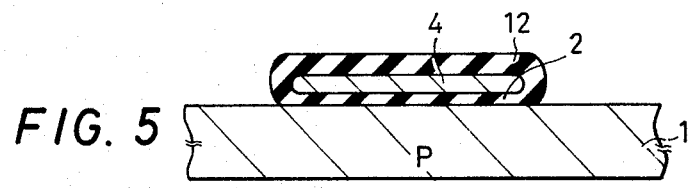
Figure 6:
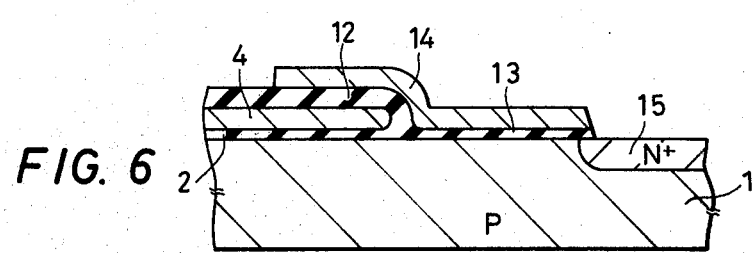
FIGS. 6 through 8 are sectional views each showing the semiconductor device obtained in accordance with the method of the present invention.

The surface of the Si substrate 1 exposed from the semiconductor substrate having the structure shown in FIG. 5 is oxidized to form a gate oxide film 13. A second poly-Si layer 14 is formed on this gate oxide film 13 and the poly-Si layer 14 and the gate oxide film 13 are continuously machined by photoetching. Thereafter, as shown in FIG. 6, an impurity such as arsenic (As) or phosphorous (P) is introduced into the Si substrate by an ion implantation or heat diffusion method using the poly-Si layer 14 as a mask, thereby forming an N$^+$ type semiconductor region 15.

Though not shown, at least a PSG film serving as an inter-layer insulation film is then formed, and a connection hole for the connection of an electrode is bored in the PSG film. An aluminum electrode to be connected to the N$^+$ type semiconductor region 15 is formed through this connection hole.

There is thus obtained a memory cell consisting of a MISFET using the poly-Si layer 14 as the gate electrode and a capacitor using the poly-Si layer 4 as one electrode.

EMBODIMENT 3

A method of obtaining a CCD from the fabrication method of the semiconductor device described in Embodiment 1 will be explained.

Figure 7:
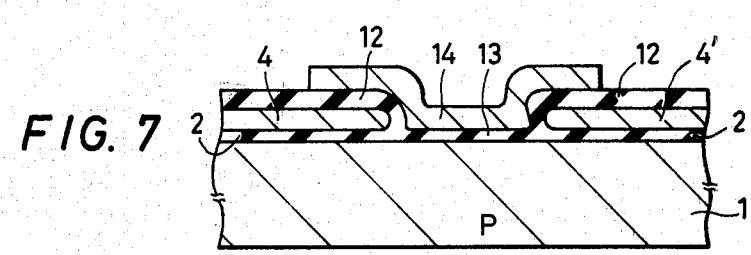

A gate oxidation film 13 is formed between the poly-Si layers 4 and 4' as shown in FIG. 7 is the same way as the memory cell of Embodiment 2 and the poly-Si layer 14 is formed on the gate oxidation film 13. In the case of the CCD, the poly-Si layers 4, 4', 14 function as a reversible gate electrode. The SiO$_2$ films 2 and 13 are formed to have substantially the same thickness with each other.

EMBODIMENT 4

Figure 8:
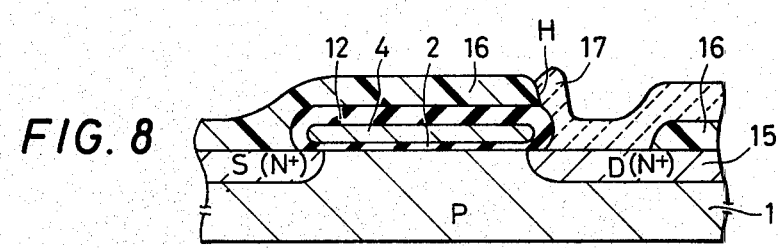

The method of the present invention provides a semiconductor device which will be explained as follows. A semiconductor device having a structure in which an electrode lead 17 extended from an N$^+$ type semiconductor region 15 adjacent to a poly-Si gate electrode 4 as shown in FIG. 8 can be obtained without causing an electric short-circuit even when it is brought into masking contact with the poly-Si portion.

To obtain this semiconductor device, after the semiconductor substrate shown in FIG. 5 is obtained, an impurity such as As or P is introduced by the heat diffusion method or ion implantation method thereby to form a source drain layer SD. Impurity doping for forming the source drain layer SD may be carried out after the nitrogen ion implantation shown in FIG. 2. After the thermal oxidation film formed at the time of the formation of the source drain layer is removed, a PSG film containing P$_2$O$_5$ in a high concentration (about 10 mol%) is formed to a thickness of 0.8 μm by a CVD (Chemical Vapor Deposition) process, and a connection hole H for the electric connection between the drain layer D and an aluminum electrode lead is bored in the PSG film. In forming this connection hole H, a mixed solution of dilute hydrofluoric acid and an aqueous, saturated ammonium fluoride solution is employed. This etching solution provides a ratio of the etching speed of about 10 times between the thermal oxidation film and the PSG film immediately after its formation by the CVD process. Accordingly, even when the connection hole H bridges over the poly-Si layer 4 coated with the thermal oxidation film 12, the thermal oxidation film 12 is hardly etched. In other words, the poly-Si layer 4 is protected at least by the thermal oxidation film 12. Incidentally, at the position where the connection between the poly-Si layer 4 and the aluminum electrode lead is bored in advance by the photoetching of the thermal oxidation film, the same position of the PSG film 16 is bored thereafter.

After the connection hole H is formed, the PSG film 16 is heat treated at 1,000° C. to 1,050° C. to make the surface flat. Subsequently, the electrode wiring consisting of aluminum as the principal component is formed thereby to realize the semiconductor device shown in FIG. 8.

EMBODIMENT 5

The definite method of forming the memory cell explained in Embodiment 2 will be explained in further detail by referring to FIGS. 9 through 30.

(1) As the semiconductor substrate 101, a Si substrate of a P type single crystal having a (100) crystal surface and a resistivity of 8 to 12 Ohm·cm is employed. The oxygen impermeable layer to be used as the selective oxidation mask is formed in the surface of this Si substrate.

Figure 9:
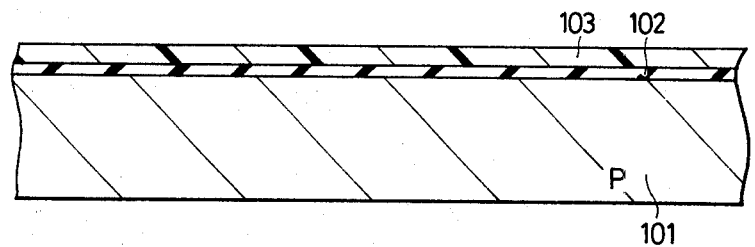
FIGS. 9 through 30 are sectional views each showing step-wise the semiconductor device in accordance with another embodiment of the present invention.

A silicon nitride film is used as this oxygen impermeable layer. As is known in the art, a crystal defect occurs on the surface of the Si substrate 101 if the silicon nitride film is directly formed on the surface of the Si substrate 101. Accordingly, about a 50 nm-thick silicon oxide (SiO$_2$) film 102 is first formed by thermally oxidizing the surface of the Si substrate 101 as shown in FIG. 9. Next, the silicon nitride (Si$_3$N$_4$) film 103 of a thickness of 140 nm is formed by the CVD (Chemical Vapor Deposition) process.

Figure 10:
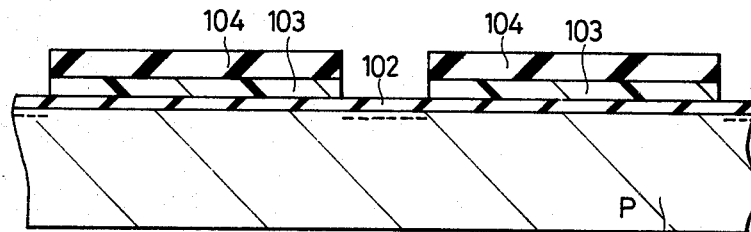

(2) In order to expose the surface of the substrate other than the region in which the memory cell is to be formed, a photoresist film 104 is formed selectively on the Si$_3$N$_4$ film 103. Under this state, the Si$_3$N$_4$ film 103 at the exposed portion is removed by the plasma etching, thereby exposing the SiO$_2$ film 2 as illustrated in FIG. 10. Thereafter, a P type impurity ion is implanted into the surface of the Si substrate 101 through the exposed SiO$_2$ film 102 in order to prevent the formation of a inversion layer (N layer) on the surface of the Si substrate 101. In order words, boron ion (B ion) is doped at a dose of $3 \times 10^{12}$ atoms/cm$^2$ at an energy of 75 KeV into the Si substrate 101 of the portion not having the photoresist film 104 through the exposed SiO$_2$ film 102 using the abovementioned photoresist film 104 as the mask.

Figure 11:
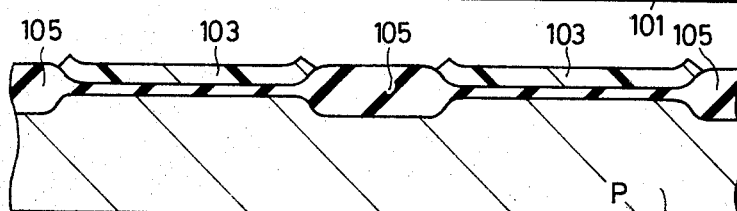
Figure 12:
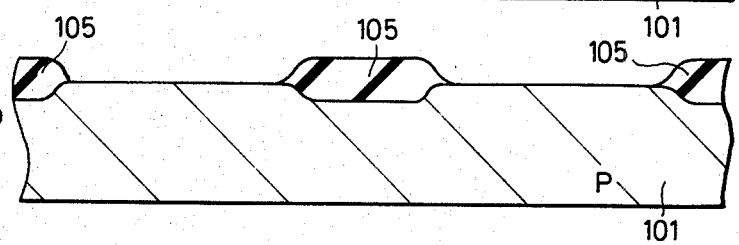

(3) After the photoresist film 104 is removed, the Si substrate is heated in the wet O$_2$ atmosphere in order to carry out the selective oxidation of the Si substrate. In this instance, the surface of the Si substrate 101 immediately below the Si$_3$N$_4$ film 103 is not oxidized because the Si$_3$N$_4$ film 103 does not permeate the oxygen to the surface of the Si substrate. On the other hand, the surface of the Si substrate 101 immediately below the exposed SiO$_2$ film 102 is oxidized because the SiO$_2$ film allows the permeation of the oxygen. Namely, selective oxidation of the Si substrate 101 is thus effected. As a result, there is obtained a relatively thick SiO$_2$ film (field SiO$_2$ film) 105 of a thickness of about 950 nm in the embedded state into the Si substrate 101 as illustrated in FIG. 11. At the time of the formation of the field SiO$_2$ film 105, the boron implanted in the abovementioned manner is subjected to the extension diffusion so that the inversion layer-blocking region having a higher impurity concentration than the impurity concentration of the surface of the Si substrate 101 is formed. This inversion layer-blocking region is not shown in the drawings.

(4) In order to expose the surface of the Si substrate at the portion where the field SiO$_2$ film 105 is not formed, the Si$_3$N$_4$ film 103 is first removed by etching using a hot phosphoric acid (H$_3$PO$_4$) solution, for example, and then the SiO$_2$ film 102 is perfectly removed using hydrofluoric acid (HF), for example, thereby exposing the surface of the Si substrate at such a portion where the SiO$_2$ film 105 is not formed.

Figure 13:
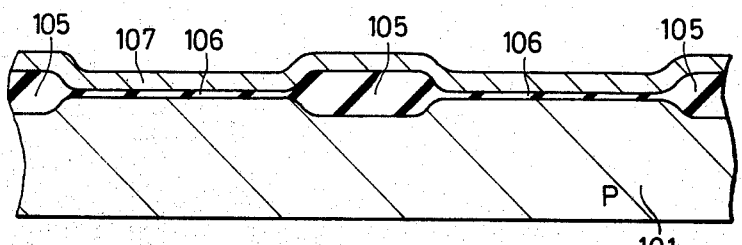

(5) As shown in FIG. 13, the exposed surface of the Si substrate 101 is oxidized to form about a 43 nm-thick SiO$_2$ film 106 which is to serve as a dielectric layer of a capacitor forming the memory cell. This SiO$_2$ film 106 is formed by heating the Si substrate at a temperature of 1,100° C. for 20 minutes in the oxidizing atmosphere. Subsequently, a first poly-Si layer 107 of a thickness of about 400 nm is formed on the field SiO$_2$ film 105 and SiO$_2$ film 106 by the CVD process. Phosphorous is then doped into this poly-Si layer 107 by the diffusion process.

Figure 14:
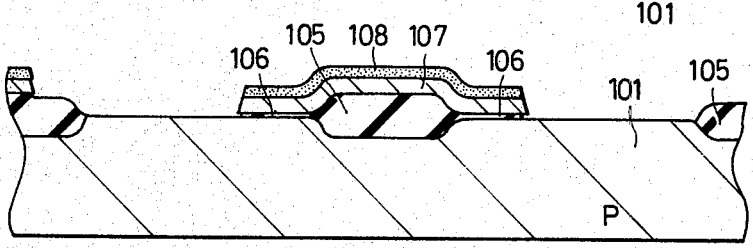

(6) In order to form an electrode of the capacitor forming the memory cell, the abovementioned poly-Si layer 107 is patterned in a desired shape as shown in FIG. 14. In other words, a photoresist film 108 of a desired shape is left by the photo etching process and the poly-Si layer 107 is removed by etching using this photoresist film 108 as a mask. Further, the SiO$_2$ film 106 is removed by etching using the poly-Si layer 107 as a mask in order to expose the surface of the Si substrate 1.

Figure 15:
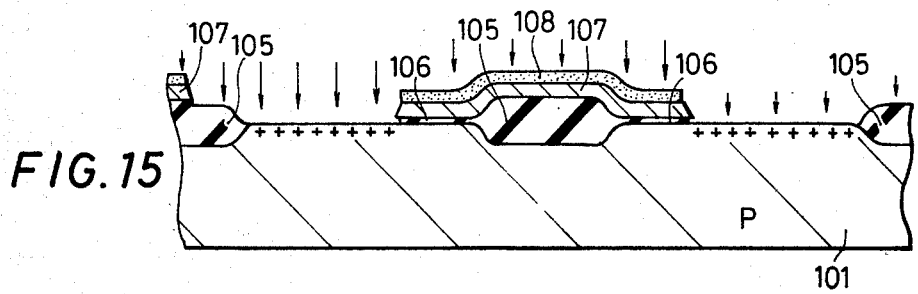
Figure 16:
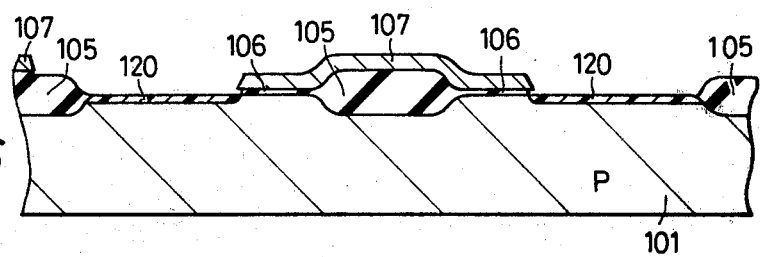
Figure 17:
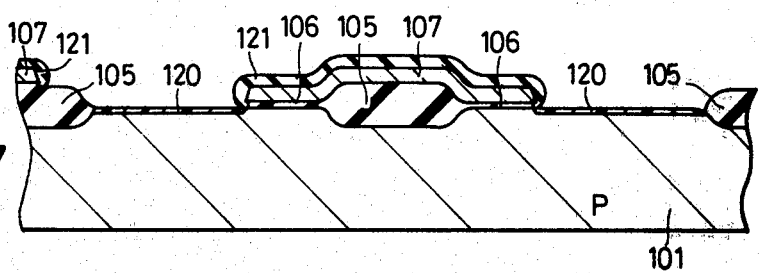

(7) Next, in order to form an oxygen impermeable layer, or, an Si$_3$N$_4$ film, on the surface of the Si substrate 101 at which the poly-Si layer 107 is not formed, the nitrogen ion is first doped by the ion implantation process into the exposed surface of the Si substrate 101 as shown in FIG. 15. The ion dose is $10^{17}$ atoms/cm$^2$, for example. The implantation energy is selected to a low level, e.g., 30 KeV, so that the photoresist film 108 does not reach the poly-Si layer 107. Next, after the photoresist film 108 is removed, the heat treatment is carried out in the same way as in Embodiment 1, thereby allowing the nitrogen ion implanted in the surface of the Si substrate 101 to react with the Si of the substrate. As a result, a 50 nm-thick Si$_3$N$_4$ film 120 is formed on the exposed surface of the Si substrate 1 as shown in FIG. 16.

(8) To form an inter-layer insulation film on the surface of the poly-Si layer 107, the surface of the poly-Si layer 107 is thermally oxidized in the wet O$_2$ atmosphere of 900° C., for example, thereby forming a 300 nm thick SiO$_2$ film 121 on the poly-Si layer 107. During the surface oxidation of this poly-Si layer 107, the surface of the Si-substrate 101 immediately below the Si$_3$N$_4$ film 120 is not oxidized owing to the presence of the Si$_3$N$_4$ layer 120.

Figure 18:
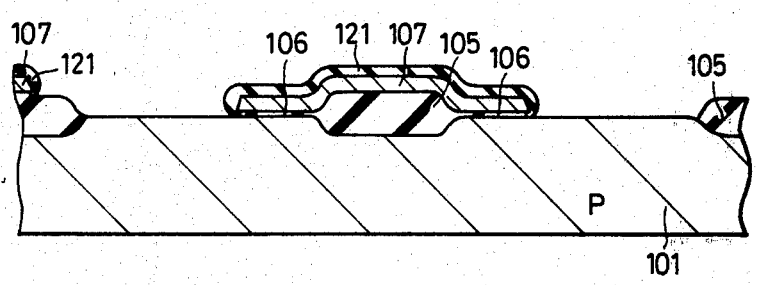
Figure 19:
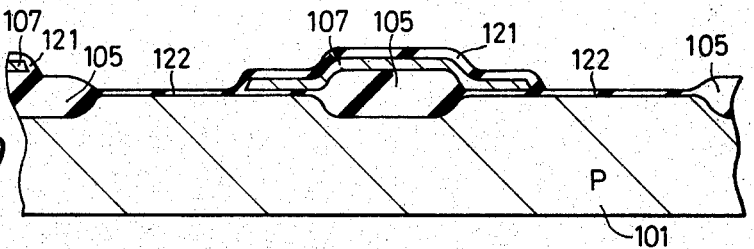

(9) To form a gate insulation film (SiO$_2$ film) on the surface of the Si substrate 101, the Si$_3$N$_4$ film is first removed by etching using a hot phosphoric acid (H$_3$PO$_4$) solution as shown in FIG. 18 to expose the surface of the Si substrate 1. Next, the exposed surface of the Si substrate 1 is oxidized as shown in FIG. 19 thereby to form a 53 nm-thick SiO$_2$ film 122.

Figure 20:
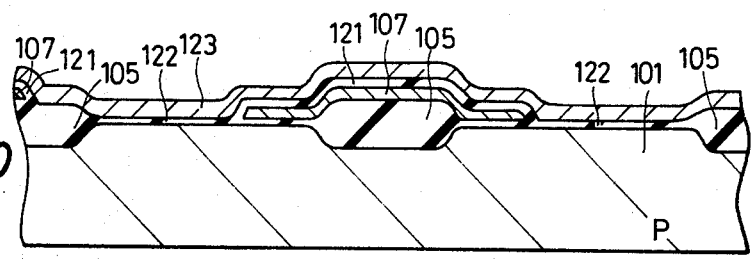
Figure 21:
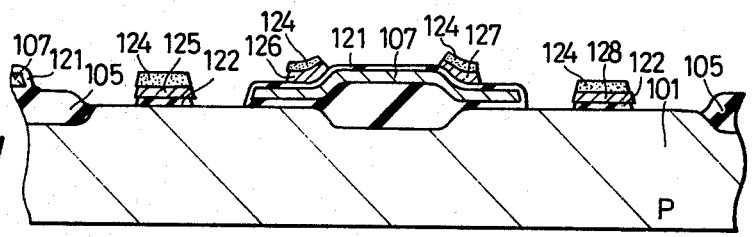

(10) Next, to form a gate electrode of an MISFET or a wiring layer, a second poly-Si layer 123 of a thickness of about 350 nm is formed on the SiO$_2$ films 121, 122 by the CVD process as shown in FIG. 20. The poly-Si layer 123 is then patterned in a desired shape. In other words, a photoresist film 124 of a desired size and shape is left by photoetching and the abovementioned poly-Si layer 123 is removed by etching using this photoresist film 124 as the mask, thereby forming the gate electrode or wiring layers 125–128. Further, to expose the surface of the Si substrate 101, the SiO$_2$ film 122 is removed by etching using the poly-Si layers 125–128 as the mask as shown in FIG. 21.

Figure 22:
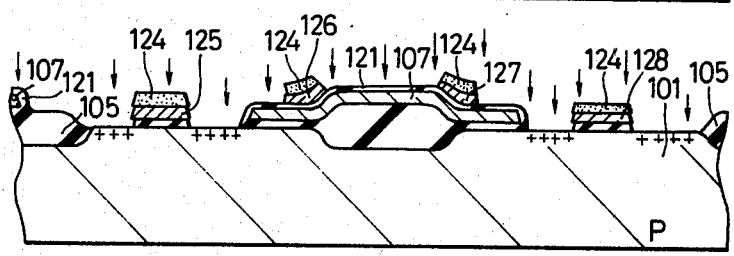
Figure 23:
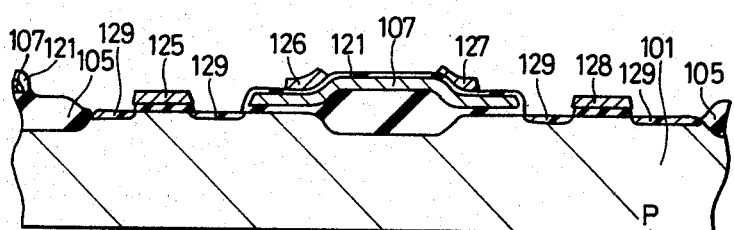

(11) To form an oxygen impermeable layer, or, an Si$_3$N$_4$ film, on the surface of the Si substrate 101 at a portion where the poly-Si layers 125–128 are not formed, the nitrogen ion is first doped by the ion implantation process into the exposed surface of the Si substrate 101 under the state where the photoresist 124 is left as shown in FIG. 22. The ion dose is $10^{17}$ atoms/cm$^2$. The implantation energy is selected to a low level, e.g., about 30 KeV, so that the photoresist film 124 does not reach the poly-Si layer 123. After the photoresist film 124 is subsequently removed, the Si substrate 101 is thermally treated thereby to react the nitrogen implanted into the surface of the Si substrate 101 with the Si of the substrate. As a result, there is formed a 50 nm-thick Si$_3$N$_4$ film 129 on the exposed surface of the Si substrate 101 as shown in FIG. 23.

Figure 24:
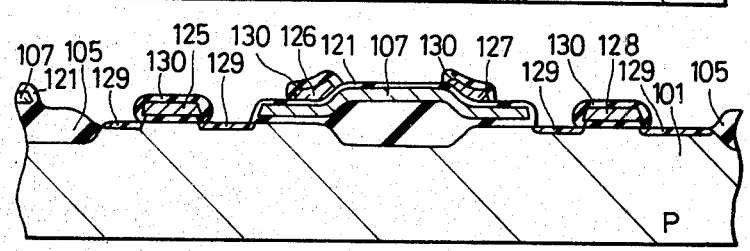

(12) To form a stable inter-layer insulation film on the surfaces of the poly-Si layers 125–128, the surfaces of the poly-Si layers 125–128 are oxidized in the wet oxygen atmosphere of 900° C., for example, as shown in FIG. 24, thereby forming a 300 nm thick SiO$_2$ film 130 on the poly-Si layers 125–128. During the surface oxidation of the poly-Si layers 125–128, the surface of the Si substrate 101 immediately below the Si$_3$N$_4$ film 129 is not oxidized owing to the presence of the Si$_3$N$_4$ layer 129.

Figure 25:
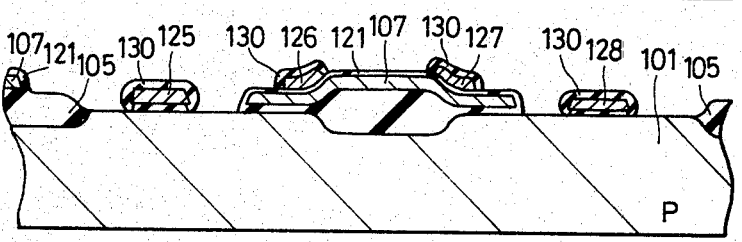

(13) To clean the surface of the Si substrate 101 at a portion where the source drain region is to be formed, that is, the surface of the Si substrate 101 immediately below the Si$_3$N$_4$ film 129, the Si$_3$N$_4$ film 129 is removed by etching using a hot phosphoric acid (H$_3$PO$_4$) solution as shown in FIG. 25, thereby exposing the surface of the Si substrate 101 at which the source drain region is to be formed.

Figure 26:
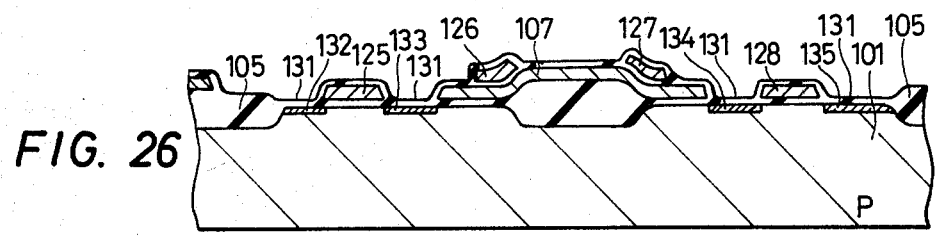

(14) In order to prevent the ion damage of the exposed surface of the Si substrate when the impurity ion is implanted into the surface for forming the source drain region, the exposed surface of the Si substrate 101 is first oxidized to form an $SiO_2$ film 131 on its surface as shown in FIG. 26. Thereafter, an impurity ion exhibiting the opposite type conduction, or, N type conducting, such as arsenic ion (As ion), to the P type conduction of the Si substrate 101 is introduced into the Si substrate 101 by the ion implantation process. The ion implantation energy at this time is set to a low level, e.g., about 80 KeV, so that the arsenic ion does not reach the poly-Si layers 102, 103 and the surface of the Si substrate 101 immediately below the field $SiO_2$ film 105. As shown in FIG. 26, therefore, N+ type conductor regions 132-135 are selectively formed inside the Si substrate 101 so as to function as the source drain region.

Figure 27:
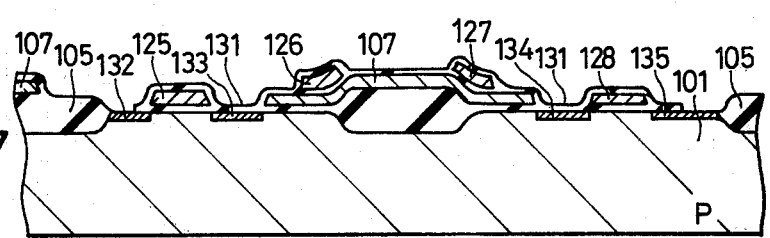

(15) To form easily a contact hole, the $SiO_2$ film 131 is etched by the photoetching technique as shown in FIG. 27 so as to selectively expose the surface of the N+ type conductor regions 132, 155.

Figure 28:
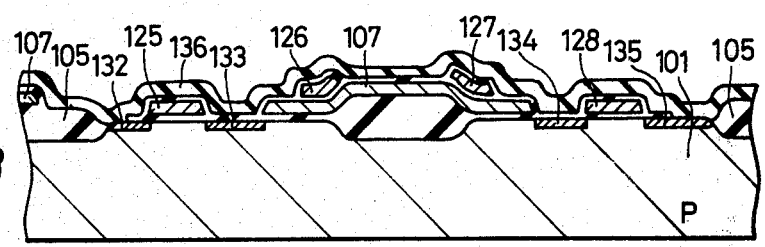

(16) To adsorb impurity ions such as Na ion and to realize inter-layer insulation, an 800 nm-thick PSG film 136 is formed by the CVD process as shown in FIG. 28.

Figure 29:
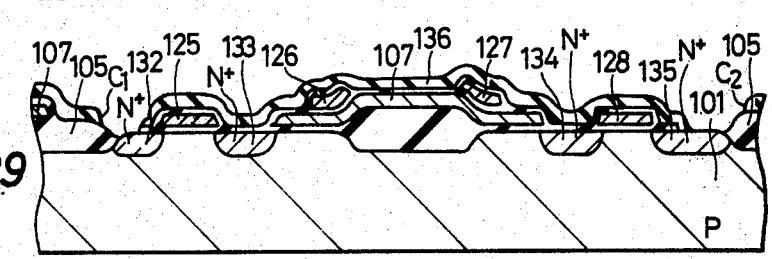

(17) The PSG film 136 is etched by the photoetching process as shown in FIG. 29 in order to connect an aluminum wiring layer to be later described to the N+ type conductor regions 132, 135, thereby forming contact holes $C_1$, $C_2$. Subsequently, to furnish the N+ type semiconductor regions 132-135 with a predetermined depth and to minimize the steps of the PSG film 136, the Si substrate 101 is thermally treated at 1,000° C. for 15 minutes. Due to this heat treatment, the crystal strain in the N+ semiconductor regions 132-135 can be eliminated.

Figure 30:
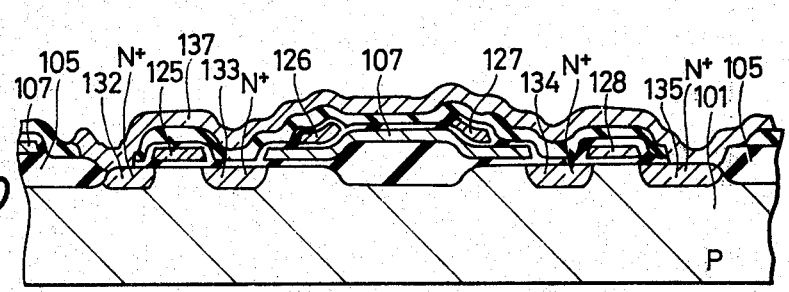

(18) To form bit lines of the memory cell, an aluminum film is first vaporized over the entire surface of the Si substrate 101 and this aluminum film is then etched by the photoetching process, thereby forming a wiring layer (bit lines) 137 as shown in FIG. 30.

Figure 31:
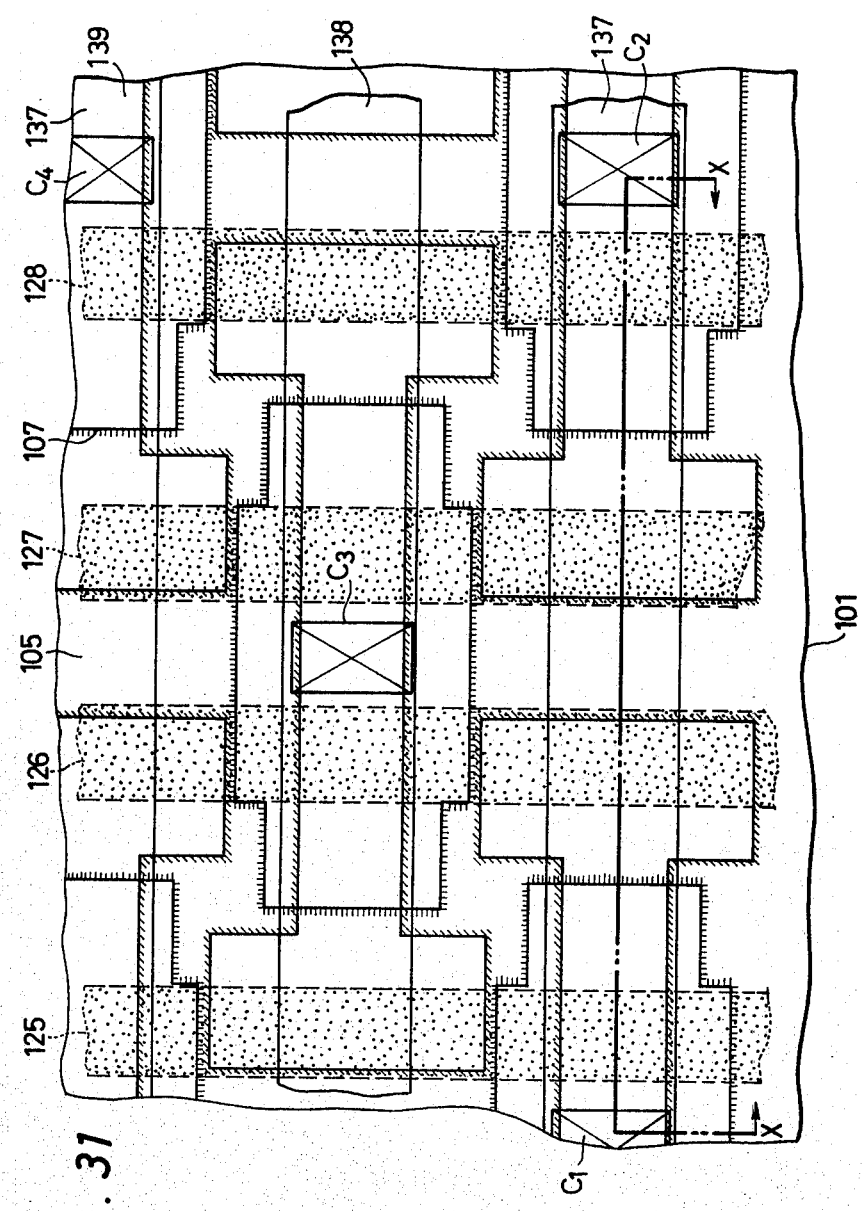
FIG. 31 is a plan view of the semiconductor device obtained by the method of the present invention.

FIG. 31 illustrates in plan the memory cell formed by the method of the abovementioned Embodiment 5. Incidentally, FIG. 30, which is a partial sectional view of the memory cell, corresponds to the portion cut along line X—Y in FIG. 31. A field $SiO_2$ film 105 is selectively formed on the Si substrate 101 and the first poly-Si layer 107 cut out in a desired shape is formed on the field $SiO_2$ film 105.

The second poly-Si layers 125-128 functioning as word lines and extending in the longitudinal direction are formed on the poly-Si layer 107. In the portion inside the Si substrate 101 encompassed by the first and second poly-Si layers and by the field $SiO_2$ film is formed an N+ type semiconductor region. Aluminum wiring layers 137, 138, 139 to serve as bit lines extending in the transverse direction to criss-cross the second poly-Si layers 125, 128 are formed on these second poly-Si layers 125, 128. The Al wiring layer 137 is connected to the N+ type semiconductor region formed inside the Si substrate at the contact portions $C_1$, $C_2$. The Al wiring layer 138 is connected to the N+ semiconductor region formed inside the Si substrate at the contact portion $C_3$. Further, the Al wiring layer 139 is connected to the N+ type semiconductor region formed inside the Si substrate at the contact portion $C_4$.

EMBODIMENT 6

Figure 32:
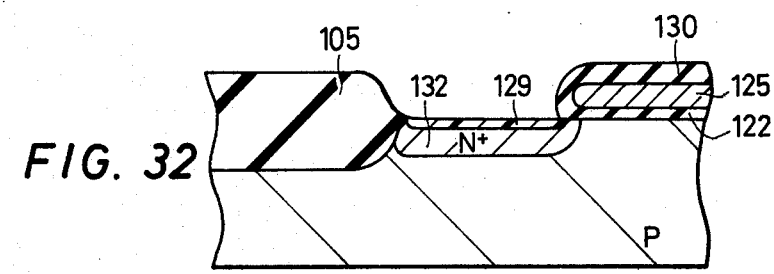
FIGS. 32 through 34 are sectional views each showing step-wise the semiconductor device in accordance with still another embodiment of the present invention.
Figure 33:
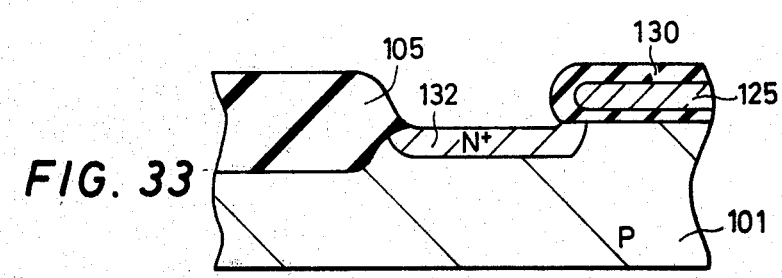
Figure 34:
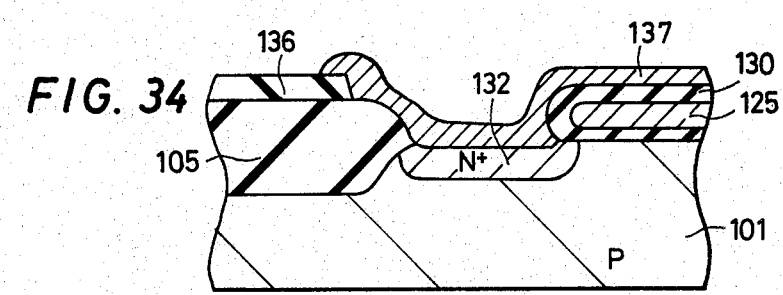

After the step (12) of the abovementioned Embodiment 5 is completed, or, after the $SiO_2$ film 130 is formed using the $Si_3N_4$ film as the mask as shown in FIG. 24, the memory cell having a contact construction between the Al wiring layers and the N+ type semiconductor regions may be formed in the following manner. Namely, as shown in FIG. 32, while the $Si_3N_4$ film 129 is left, the N+ type semiconductor region to serve as the source drain region is formed by the ion implantation process using the field $SiO_2$ film 105 and the $SiO_2$ film 130 as the mask. Next, this N+ type semiconductor region 132 is furnished with a predetermined length by heat diffusion. As shown in FIG. 33, the $Si_3N_4$ film 129 is then removed by etching using a hot phosphoric acid ($H_3PO_4$) solution to expose the surface of the N+ type semiconductor region 132. In this instance, the $SiO_2$ films 105 and 130 are hardly etched by the abovementioned etching solution. Next, as shown in FIG. 34, the PSG film 136 is selectively formed on the field $SiO_2$ film 105 and the Al wiring layer 137 to be connected to the N+ type semiconductor region 132 is formed on this PSG film.

Though the present invention has been explained in detail with reference to the definite embodiments thereof in the foregoing, the present invention provides the following effects.

(a) Since the construction of the gate portion is exactly the same as that of the conventional poly-Si gate MISFET, a stable threshold voltage can be obtained.

(b) The upper and side portions of the poly-Si gate electrode are covered with the relatively thick, compact thermal oxidation film. When it is applied to a CCD employing the poly-Si two-layer technique and to the first-layer poly-Si of a dynamic RAM, it is possible to form a semiconductor memory circuit device having small stray capacitance between the first and second poly-Si layers and high inter-layer withstand voltage.

(c) The contact hole between the N+ type semiconductor region and the Al wiring can be bored in the proximity of the poly-Si electrode and a semiconductor device having high integration density can thus be obtained.

(d) The masking layer for the formation of the abovementioned thermal oxidation film, that is, the oxygen impermeable layer, can be formed in the self-aligning manner using the poly-Si gate electrode as the mask. Hence, it is not necessary to form the oxygen impermeable layer over the entire surface of the semiconductor substrate and then to selectively remove the oxygen impermeable layer by etching.

(e) According to Embodiment 6, since the $SiO_2$ films 105, 130 are not etched during the removal of the $Si_3N_4$ film 129 by etching, the portion of the $Si_3N_4$ film formed serves as such as the contact area. In forming the contact hole (selective etching of the PSG film), therefore, it is not necessary to specifically increase the locating accuracy of the mask. Accordingly, it becomes possible to minimize the area of the contact portion and to obtain a semiconductor device having a high integration density.

Though the foregoing has been described with reference to the N channel type MOS device by way of example, the present invention is not limited to the N channel type in particular and can be applied similarly to a P channel type MOSIC, CMOSIC and the like. Further, an $Al_2O_3$ film or the like may also be used besides the $Si_3N_4$ film.

What is claimed is:

1. A method of fabricating a MIS-type device comprising the steps of:

forming selectively a conductor layer for a control electrode of the MIS-type device on an insulating layer formed on a major surface of a semiconductor substrate;

converting the surface of said semiconductor substrate, which is not covered with said conductor layer, into an oxygen impermeable layer; and oxidizing thereafter the surface of said conductor layer by using said oxygen impermeable layer as a mask to form an oxidation film on said conductor layer.

2. The method of fabricating a MIS-type device as defined in claim 1 wherein said oxygen impermeable layer is formed by nitrogen ion implantation into the surface of said semiconductor substrate.

3. A method of fabricating a MIS-type device comprising the steps of:

forming selectively a first polycrystalline semiconductor layer as a control electrode of the MIS-type device on a semiconductor oxidation film formed on a semiconductor substrate;

converting the surface of said semiconductor substrate, which is not covered with said polycrystalline semiconductor layer, into a nitride film;

oxidizing thereafter the surface of said first polycrystalline semiconductor layer by using said nitride film as a mask thereby to form a first oxidation film on said first polycrystalline semiconductor layer;

removing said nitride film to expose the surface of said semiconductor substrate;

oxidizing the exposed surface of said semiconductor substrate to form a second oxidation film on said semiconductor substrate; and forming selectively a second polycrystalline semiconductor layer as a second control electrode which extends from said second oxidation film onto said first oxidation film.

4. The method of fabricating a semiconductor device as defined in claim 3 wherein said nitride film is formed by nitrogen ion implantation into the surface of said semiconductor substrate.

5. A method of fabricating a MIS-type device comprising the steps of:

forming selectively a polycrystalline semiconductor layer as a control electrode of the MIS-type device on a semiconductor oxidation film formed on a first conduction type semiconductor substrate;

introducing a second conduction type-determining impurity opposite the first conduction type into the semiconductor substrate, which is not covered with said polycrystalline semiconductor layer, thereby to form a semiconductor region serving as a source or drain region of the MIS-type device;

converting the surface of said semiconductor substrate, which is not covered with said polycrystalline semiconductor layer, into a nitride film;

oxidizing the surface of said polycrystalline semiconductor layer by using said nitride film as a mask, thereby to form an oxidation film on said polycrystalline semiconductor layer;

removing said nitride film to expose the surface of said semiconductor region; and forming a wiring layer coming into contact with the surface of said semiconductor region and extending onto said oxidation film.

6. The method of fabricating a MIS-type device as defined in claim 5 wherein said nitride film is formed by nitrogen ion implantation into the surface of said first conduction type semiconductor substrate.

7. The method of fabricating a MIS-type device as defined in claim 5 wherein the formation of said semiconductor region is made prior to the formation of said nitride film.

8. The method of fabricating a MIS-type device as defined in claim 5 wherein the formation of said semiconductor region is made after the formation of said nitride film but before the removal of said nitride film.

9. The method of fabricating a MIS-type device as defined in claim 5 wherein the formation of said semiconductor region is made after the removal of said nitride film.

10. A method of fabricating a MIS-type device comprising the steps of:

forming selectively a conductor layer as a control electrode of the MIS-type device on a semiconductor oxidation film formed on a semiconductor substrate;

converting the portion of said semiconductor oxidation film, which is not covered with said conductor layer, into a nitride film; and oxidizing thereafter the surface of said conductor layer thereby to form an oxidation film on said conductor layer by using said nitride film as a mask.

11. The method of fabricating a MIS-type device as defined in claim 10 wherein said conductor layer consists of a polycrystalline semiconductor.

12. The method of fabricating a MIS-type device as defined in claim 10 wherein said nitride film is formed by nitrogen ion implantation in said semiconductor oxidation film.

13. A method of fabricating a MIS-type device comprising the steps of:

forming selectively a first polycrystalline silicon layer serving as a first control electrode of the MIS-type device on an insulating layer formed on a major surface of a silicon substrate;

forming a nitride film in each of the surface portions of said silicon substrate, which are located on the opposite sides of said first polycrystalline silicon layer and not covered with said first polycrystalline silicon layer, by implanting nitrogen ions into said surface portions of said silicon substrate; and subjecting said first polycrystalline silicon layer of the resultant silicon substrate to oxidation by using said nitride film as an oxygen impermeable mask, thereby to form a first silicon oxide film at the exposed surface of said first polycrystalline silicon layer.

14. A method of fabricating a MIS-type device as defined in claim 13, further comprising the succeeding steps of:

removing said nitride film to expose at least one of said surface portions of said silicon substrate;

oxidizing the exposed surface of said silicon substrate thereby to form on said silicon substrate a second silicon oxide film adjacent to said insulating layer underlying said first polycrystalline silicon layer; and forming selectively a second polycrystalline silicon layer serving as a second control electrode of the MIS-type device on said second silicon oxide film so as to extend from said second silicon oxide film onto said first silicon oxide film.

15. A method of fabricating a MIS-type device as defined in claim 14, wherein said succeeding steps further include the step of doping an impurity of the conductivity type opposite to said silicon substrate into the surface portion of said silicon substrate, which is located on the side of said second polycrystalline silicon layer portion formed on said second silicon film, thereby to form a semiconductor region serving as a drain or source region of the MIS-type device.

16. The method of fabricating a MIS-type device as defined in claim 1, 3, 5 or 10, wherein said semiconductor substrate is a silicon substrate and the control electrode is formed of polycrystalline silicon.

* * * * *